(12) United States Patent
Chou et al.

(10) Patent No.: US 8,542,027 B2
(45) Date of Patent: Sep. 24, 2013

(54) PROBE CARD

(75) Inventors: Young-Huang Chou, Zhubei (TW); Wei-Cheng Ku, Zhubei (TW); Wen-Pin Su, Zhubei (TW); Jun-Liang Lai, Zhubei (TW); Chao-Ping Hsieh, Zhubei (TW); Ping-Hsiao Liao, Zhubei (JP)

(73) Assignee: MPI Corporation, Zhubei (TW)

( * ) Notice: Subject to any disclaimer, the term of this patent is extended or adjusted under 35 U.S.C. 154(b) by 492 days.

(21) Appl. No.: 12/725,909

(22) Filed: Mar. 17, 2010

(65) Prior Publication Data
US 2010/0237886 A1 Sep. 23, 2010

(30) Foreign Application Priority Data

Mar. 18, 2009 (TW) ................. 98108833 A

(51) Int. Cl.
*G01R 31/20* (2006.01)
(52) U.S. Cl.
USPC .................................... 324/754.01

(58) Field of Classification Search
USPC ................ 324/762.01–762.1, 754.01–754.3, 324/755.01–755.11; 257/48; 438/14–18
See application file for complete search history.

(56) References Cited

U.S. PATENT DOCUMENTS

| | | | | |
|---|---|---|---|---|
| 6,606,575 | B2 * | 8/2003 | Miller | 702/104 |
| 6,781,364 | B2 * | 8/2004 | Kawasaki et al. | 324/762.01 |
| 6,900,627 | B2 * | 5/2005 | Mori et al. | 324/756.07 |
| 7,327,153 | B2 * | 2/2008 | Weinraub | 324/756.01 |

* cited by examiner

*Primary Examiner* — Tung X Nguyen
(74) *Attorney, Agent, or Firm* — Tracy M. Heims; Apex Juris, pllc

(57) ABSTRACT

A probe card is provided. The probe card can serialize, analogize and divide a digital signal by a analog-to-digital converter (ADC), a digital-to-analog converter (DAC), and a power divided unit respectively. The probe card can increase signal channels, and is not restricted by signal channels of a tester to test more DUTs simultaneously. Moreover, the probe card has fine impedance matching and channels separating to raise testing efficiency and reduce signal loss.

14 Claims, 3 Drawing Sheets

PROBE CARD

BACKGROUND OF THE INVENTION

1. Field of the Invention

The present invention relates generally to a probe card, and more particularly to a probe card capable of distributing a signal to several terminals.

2. Description of the Related Art

In the process of fabricating integrated circuit (IC), probe card is used to test integrated circuits on a wafer prior to packaging process. Typically, probe card electrically connects a tester and devices under test (DUTs), each of which includes an integrated circuit. The probe card has needles firmly contacted to the integrated circuits to test the function of the integrated circuits of DUTs. The faulted DUTs are marked to find the yield rate of the integrated circuits, and then performing packaging process. Probe card is the most important device for testing process that it is very important in the processes of fabricating integrated circuit.

However, it usually causes a signal integrity problem in the circuit of the conventional probe card, which will cause errors in the testing process. Besides, the number of tested DUTs at a time is restricted by the number of the signal channels of the tester, which will cause a limitation of the number of DUTs for test and the speed of test, and therefore slows down the efficiency of fabrication. So, how to provide an improved probe card circuit in association with the conventional tester in order to increase the signal channels for a high testing efficiency and improve the integrity in signal transmission for a high testing quality is an important problem to be solved.

U.S. Pat. No. 6,965,248 provides an improved circuit of a probe card to increase signal channels through a set of resistors and a compensative circuit. However, it will cause a loading effect between the channels while the number of the channels is increased, which needs a complex compensative circuit to fix. On the other words, the probe card referred here still has problems in real application. U.S. Pat. No. 7,012,442 discloses a system for increasing signal channels which employs a set of resistors to form a distribution network, and it will have a poor signal transmission quality and high signal power loss and noise because of the impedance matching in a high operation frequency.

To overcome the drawbacks of the prior art, the present inventors invented a probe card through a series of tests and studies. It employs the functions of analog-to-digital conversion and power distribution of analog signal in association with serialization of digital signal to increase the number of the signal channels and raise the integrity and separation of signal transmission and reduce the signal power loss and noise.

SUMMARY OF THE INVENTION

The primary objective of the present invention is to provide a probe card, which can serialize, analogise and divide a digital signal by a parallel-to-serial converter, a parallel-to-serial converter and a power divided unit respectively. The probe card can increase signal channels, and is not restricted by signal channels of a tester, and therefore test more DUTs simultaneously. Moreover, the probe card has fine impedance matching and channels separating to raise testing efficiency and reduce signal loss.

According to the objective of the present invention, a probe card includes a first converter connected to a tester to serialize a signal from the tester into a serial signal, a modulator connected to the first converter to analogise the serial signal from the first converter into an analog serial signal, a power divided unit connected to the modulator to divide the analog serial signal into a plurality of analog serial signals and transmit the analog serial signals to signal channels respectively, a demodulator connected to the signal channels to digitalize the analog serial signals from the signal channels into a digital serial signal, and a second converter connected to the demodulator to parallelize the digital serial signal from the demodulator into a digital parallel signal and transmit the digital parallel signal to a device under test.

In an embodiment, the signal channels may be transmission lines, a pattern on a printed circuit board, or signal wires.

In an embodiment, the power divided unit may be a power divider, a switch, or a capacitor.

In an embodiment, the second converter is further connected to a buffer to avoid interference in signal transmission.

In an embodiment, the second converter is further connected to a register to synchronize the digital signal from the second converter.

In an embodiment, the present invention further includes a comparator between the second converter and the register to compare the digital parallel signal from the second converter with a testing signal from the device under test.

According to the objective of the present invention, a probe card, which connects a tester and a device under test, includes a modulator connected to the tester to analogise a signal from the tester into an analog signal, a power divided unit connected to the modulator to divide the analog signal into a plurality of analog signals and transmit the analog signals to signal channels respectively, and a demodulator connecting the signal channels and the device under test to digitalize the analog signals from the signal channels into a digital signal and transmit the digital signal to the device under test.

In an embodiment, the present invention further includes a first converter in the tester terminal to serialize the digital signal from the tester into a serial signal and a second converter in the device under test terminal to parallelize the serial signal into a parallel signal and transmit the parallel signal to the device under test.

In an embodiment, the signal channels may be transmission lines, a pattern on a printed circuit board, or signal wires.

In an embodiment, the power divided unit may be a power divider, a switch, or a capacitor.

In an embodiment, the demodulator is further connected to a buffer to avoid interference in signal transmission.

In an embodiment, the second converter is further connected to a register to synchronize the digital signal from the second converter.

In an embodiment, the present invention further includes a comparator between the second converter and the register to compare the digital parallel signal from the second converter with a testing signal from the device under test.

According to the objective of the present invention, a probe card includes a tester terminal and a device under test terminal, wherein the tester terminal is connected to a tester to modulate a digital signal into an modulated analog signal, and the device under test terminal is connected to a device under test to demodulate the modulated analog signal from the tester terminal into a demodulated digital signal.

In an embodiment, the present invention further provides a first converter in the tester terminal to serialize the digital signal from the tester into a serial signal and a second converter in the device under test terminal to convert the demodulated digital signal into a digital parallel signal.

In an embodiment, the present invention further provides a power divided unit connecting the tester terminal and the device under test terminal to divide and transmit the analog signal from the tester terminal to the device under test terminal.

DETAILED DESCRIPTION OF THE INVENTION

Figure 1:
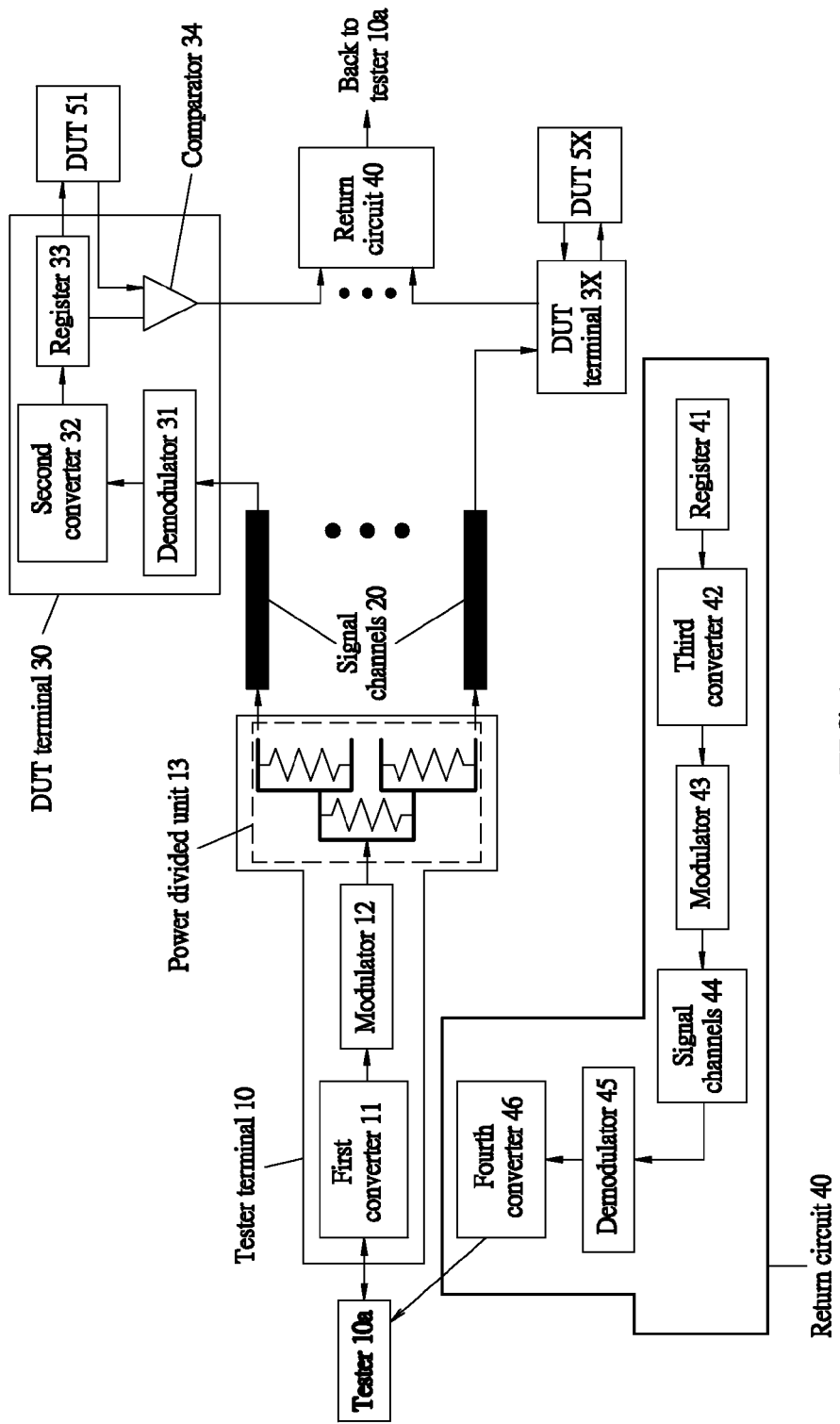
FIG. 1 is the circuit of the probe card of a first preferred embodiment of the present invention.

FIG. 1 shows is a circuit of a probe card 1 of the first preferred embodiment of the present invention. The probe card 1 includes a tester terminal 10, a plurality of signal channels 20, a plurality of device under test (DUT) terminals 30, and a return circuit 40. The tester terminal 10 connects a tester 10a to receive signals from the tester 10a. The signal channels 20 connects the tester terminal 10 and the DUT terminals 30 to transmit signals between the tester terminal 10 and the DUT terminals 30. Each DUT terminals 30 connects a device under test (DUT) 51 to transmit signals to the DUT 51 or receive signal from the DUT 51. The return circuit 40 receives the signals from the DUT terminals 30 and transmits them to the tester 10a to complete a testing procedure of the probe card 1. The function of the return circuit 40 is identical to the tester terminal 10, the signal channels 20, and the DUT terminals 30.

The tester terminal 10 includes a first converter 11, a modulator 12, and a power divided unit 13. The first converter 11 is a parallel-to-serial converter to convert a parallel signal from the tester 10a to a serial signal, and transmits the serial signal to the modulator 12. This arrangement provides a serial connection to reduce the channels for signal transmission. The modulator 12 is a digital-to-analog converter (DAC) to convert the digital serial signal into an analog serial signal. The power divided unit 13 may a power divider, a switch, or a capacitor, or a combination of above. The power divided unit 13 divides the analog serial signal from the modulator 12 into several signals and transmits them to the signal channels 20. As shown in FIG. 1, for example, the power divided unit 13 divides the analog serial signal into four signals. The number of divided signals may be changed according to the number of the signal channels 20.

The modulator 12 of the present invention may be an amplitude-shift keying (ASK), a frequency shift keying (FSK), a phase-shift keying (PSK), or a quadrature amplitude modulation (QAM) for a digital-to-analog conversion. The signal channels 20 of the present invention, which are the same as the channels in the conventional probe card, are pattern on a PCB. However, the signals in the present invention, which are converted by the modulator, are analog signal that the signals may be direct currents, radio-frequency signals, or analog signals. In practice, the signal channels 20 may be any means except for the pattern on PCB to transmit above signals. Except for the pattern of PCB, the signal channels also may be signal wires or transmission lines.

The DUT terminals 30 connect the signal channels 20 and the DUTs 51. Each DUT terminal 30 includes a demodulator 31, a second converter 32, a register 33, and a comparator 34. The demodulator 31 is an analog-to-digital converter (ADC) connected to the signal channel 20 to convert the analog serial signals from the signal channel into digital serial signals. The second converter 32 is a serial-to-parallel converter connected to the demodulator 31 to convert the digital serial signals from the demodulator 31 into digital parallel signals and to transmit them to the register 33. That is the second converter 32 parallelizes the digital serial signals from the demodulator 31 into digital parallel signals. The register 33 synchronizes the digital parallel signals from the second converter 32 and transmits them to the DUT 51. The comparator 34 is associated with the register 33 to compare the digital parallel signals transmitted to the register 33 with a testing signal from the DUT 51 to the comparator 34. The comparator 34 transmits the testing signal after comparison, such as error bit or signals indicating that the DUT is false, to the return circuit 40.

The circuit between the DUT terminals 30 and the DUT 51 is a needle of the DUT terminals 30 contacting the DUT 51. In practice, the circuit may be a plurality of needles connecting the corresponding comparator and register. In the present invention, the signals are transmitted in one way, and it may be incorporated in an address bus to transmit signals to the DUT. Besides, the DUT terminals 30 may be provided with a buffer to avoid interference between the input and output signals. The buffer may be connected to the second converter 32 or provided at any suitable place to achieve the above functions.

The return circuit 40 enables a two-way signal transmission for the present invention. The return circuit 40 has the same circuit arrangement as tester terminal 10, the signal channels 20 and the DUT terminals 30 except that the modulator 12 and the demodulator 31 are switched, the first converter 11 and the second converter 32 are switched, and the power divided unit 13 is removed. The return circuit 40 includes a register 41, a third converter 42, a modulator 43, a signal channel 44, a demodulator 45, and a fourth converter 46. The register 41 synchronizes the signals from the DUT terminals and transmits them to the third converter 42, the modulator 43, the signal channel 44, and the demodulator 45 for serial, analog, digital, and parallel process. The fourth converter 46, and then, transmits the signal to the tester 10a to complete the testing of the DUT 51.

As shown in FIG. 1, the DUT 51, DUT 5X, and the DUT terminal 3X indicate how many DUTs are accepted in the present invention. In other words, the present invention may increase the number of the channels according to the DUTs while the tester 10a has a constant number of signal channels. Besides, some alternatives may be accepted in the present invention, such as no converter or wireless transmission for the signal channels.

Figure 2:
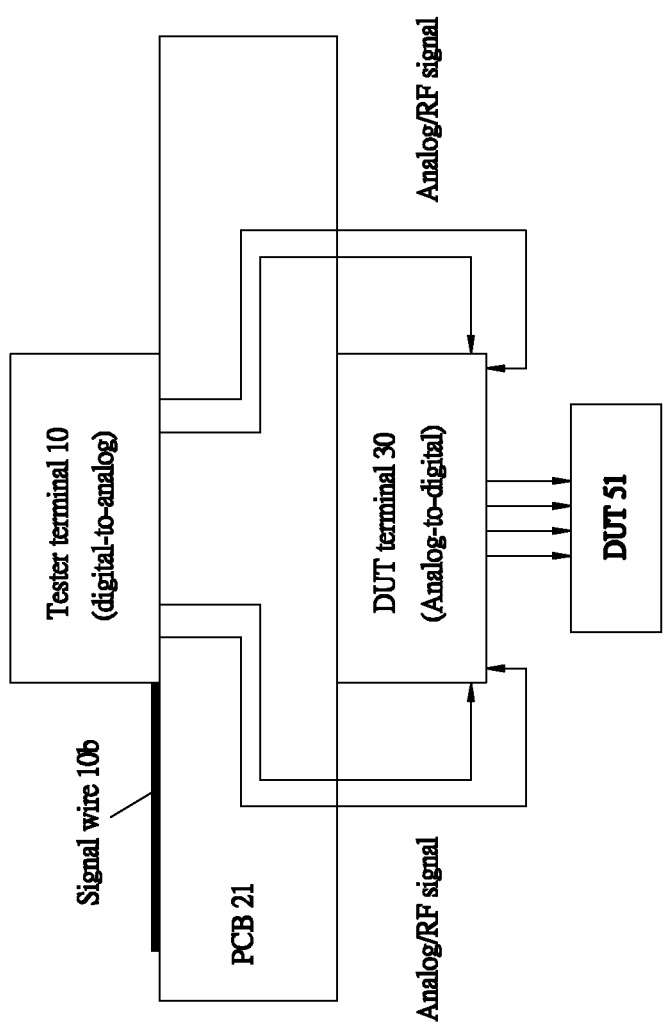
FIG. 2 is a circuit of the probe card of a second preferred embodiment of the present invention.

FIG. 2 shows a circuit of the second preferred embodiment of the present invention, in which a tester terminal 10 modulates a digital signal into an analog signal, and the analog signal is demodulated at the DUT terminal to improve the integrity of signal transmission and reduce the noise in transmission. A signal wire 10b is provided to connect the tester 10a and the tester terminal 10, and the signal wire 10b is preferred proximal to the tester 10a. The DUT terminals 30 is preferred proximal to the DUT 51 that the signals transmitted on a PCB 21 are simply analog/radio-frequency signals to improve the integrity of the digital signals and reduce the noise.

Figure 3:
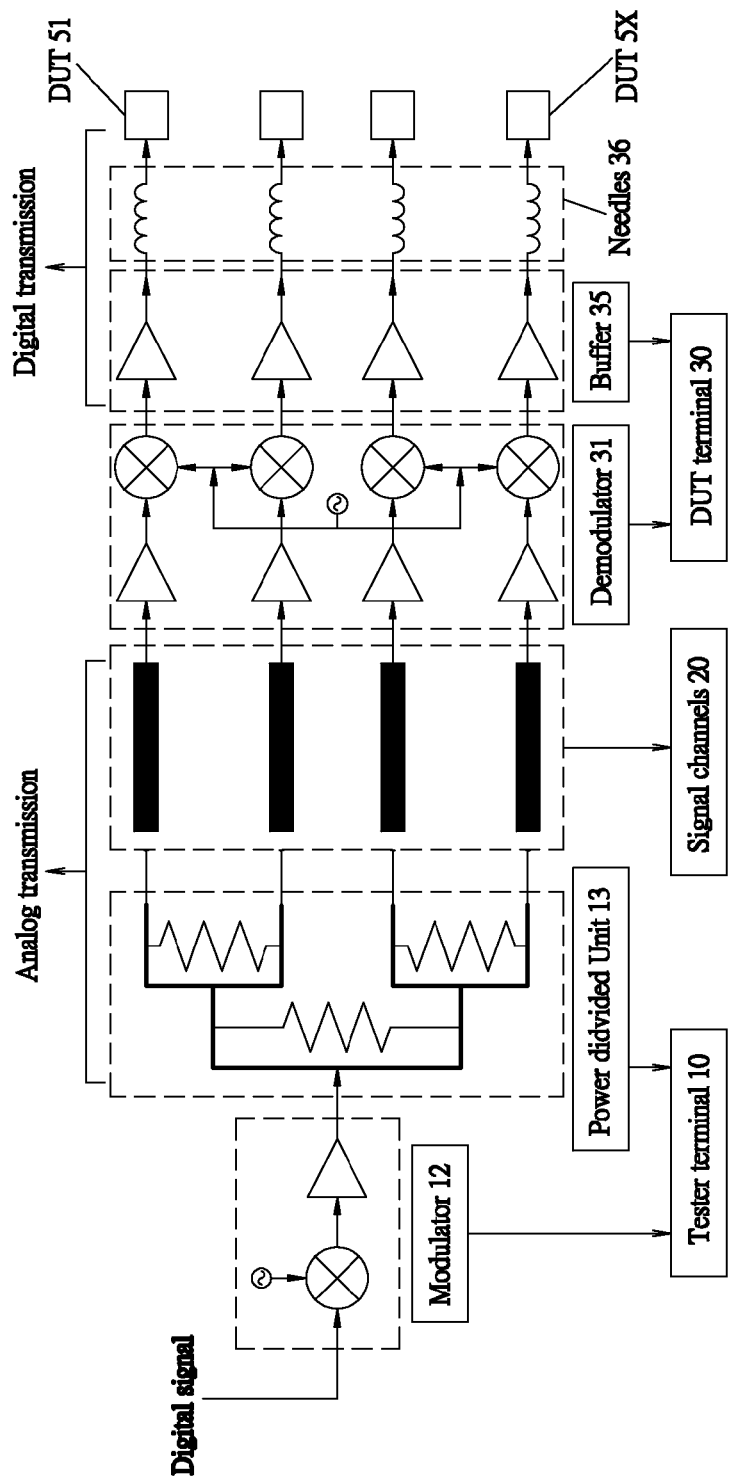
FIG. 3 is a circuit of the probe card of a third preferred embodiment of the present invention.

FIG. 3 shows a circuit of the third preferred embodiment of the present invention, in which a probe card includes a modulator 12, a power divided unit 13, signal channels 20, a demodulator 31, and a buffer 35. The modulator 12 and the power divided unit 13 are provided at a tester terminal 10, which is connected to a tester (not shown), to receive a digital signal from the tester and modulate the digital signal into an analog signal. The power divided unit 13 includes a plurality of power dividers to divide the analog signal into several signals and transmit them to a DUT terminals 30 through the signal channels 20, which are a pattern on a PCB. The demodulator 31 and the buffer 35 are provided at the DUT terminals 30 wherein the demodulator 31 demodulates the analog signals from the signal channels 20 into digital signals, and the buffer 35 may avoid signal interference and transmit the digital signals to the DUTs 51~5X through needles 36. The probe card of the third preferred embodiment may changed into a two-way transmission from one-way transmission by a return circuit, which has the same function as the return circuit 40 of the first preferred embodiment.

In conclusion, the present invention has a fan out circuit for signal dividing by resistors, and it may increase the signal channels to test more DUTs. The signals for transmission in the present invention basically are analog signals, and they only will be converted into digital signals at tester terminal and DUT terminal that the present may have a superior integrity and separation of signal transmission and reduce the signal power loss and noise to raise the competitive strength in the market.

The description above is a few preferred embodiments of the present invention and the equivalence of the present invention is still in the scope of the claim of the present invention.

What is claimed is:

1. A probe card for connecting a tester and a device under test, comprising:
    a first converter connected to the tester to serialize a signal from the tester into a serial signal;
    a modulator connected to the first converter to convert the serial signal from the first converter into an analog serial signal;
    a power divided unit connected to the modulator to divide the analog serial signal into a plurality of analog serial signals and transmit the analog serial signals to signal channels respectively;
    a demodulator connected to the signal channels to convert the analog serial signals from the signal channels into a digital serial signal; and
    a second converter connecting the demodulator and the device under test to convert the digital serial signal from the demodulator into a digital parallel signal and transmit the digital parallel signal to the device under test.

2. The probe card as defined in claim 1, wherein the signal channels are selected from the group consisting of transmission lines, a pattern on a printed circuit board, and signal wires.

3. The probe card as defined in claim 1, wherein the power divided unit is selected from the group consisting of a power divider, a switch, and a capacitor.

4. The probe card as defined in claim 1, further comprising a buffer connected to the second converter to avoid interference during signal transmission.

5. The probe card as defined in claim 1, further comprising a register connected to the second converter to synchronously output the digital signal from the second converter.

6. The probe card as defined in claim 5, further comprising a comparator between the second converter and the register to compare the digital parallel signal from the second converter with a testing signal from the device under test.

7. A probe card for connecting a tester and a device under test, comprising:
    a modulator connected to the tester to convert a signal from the tester into an analog signal;
    a power divided unit connected to the modulator to divide the analog signal into a plurality of analog signals and transmit the analog signals to signal channels respectively; and
    a demodulator connecting the signal channels and the device under test to convert the analog signals from the signal channels into a digital signal and transmit the digital signal to the device under test.

8. The probe card as defined in claim 7, wherein the signal channels are selected from the group consisting of transmission lines, a pattern on a printed circuit board, and signal wires.

9. The probe card as defined in claim 7, wherein the power divided unit is selected from the group consisting of a power divider, a switch, and a capacitor.

10. The probe card as defined in claim 7, further comprising a buffer connected to the demodulator to avoid interference during signal transmission.

11. The probe card as defined in claim 7, further comprising a register connected to the demodulator to synchronously output the digital signal from the second converter.

12. The probe card as defined in claim 11, further comprising a comparator connected to the register and the device under test to compare the signal transmitted to the device under test with a testing signal from the device under test.

13. A probe card, comprising:
    a tester terminal; and
    a device under test terminal, wherein the tester terminal is connected to a tester to modulate a digital signal into a modulated analog signal, and the device under test terminal is connected to a device under test to demodulate the modulated analog signal from the tester terminal into a demodulated digital signal;
    where said modulated digital signal is sent to said device under test; and
    where said probe card further comprises a first converter in the tester terminal to serialize the digital signal from the tester into a serial signal and a second converter in the device under test terminal to convert the demodulated digital signal into a digital parallel signal.

14. A probe card, comprising:
    a tester terminal; and
    a device under test terminal, wherein the tester terminal is connected to a tester to modulate a digital signal into a modulated analog signal, and the device under test terminal is connected to a device under test to demodulate the modulated analog signal from the tester terminal into a demodulated digital signal;
    where said modulated digital signal is sent to said device under test; and
    where said probe card further comprises a power divided unit connecting the tester terminal and the device under test terminal to divide and transmit the analog signal from the tester terminal to the device under test terminal.

* * * * *